(12) United States Patent
Izumi et al.

(10) Patent No.: US 6,773,508 B2
(45) Date of Patent: Aug. 10, 2004

(54) SINGLE CRYSTAL SILICON CARBIDE THIN FILM FABRICATION METHOD AND FABRICATION APPARATUS OF THE SAME

(75) Inventors: Katsutoshi Izumi, Sakai (JP); Motoi Nakao, Osaka (JP); Yoshiaki Ohbayashi, Nara (JP); Keiji Mine, Yao (JP); Fumihiko Jobe, Yao (JP)

(73) Assignees: Osaka Prefecture, Osaka (JP); Hosiden Corporation, Osaka (JP)

( * ) Notice: Subject to any disclaimer, the term of this patent is extended or adjusted under 35 U.S.C. 154(b) by 155 days.

(21) Appl. No.: 10/159,111

(22) Filed: Jun. 3, 2002

(65) Prior Publication Data

US 2002/0185058 A1 Dec. 12, 2002

(30) Foreign Application Priority Data

Jun. 6, 2001 (JP) ........................................ 2001-171126

(51) Int. Cl.⁷ .............................................. C30B 25/04
(52) U.S. Cl. ............................ 117/94; 117/99; 117/105
(58) Field of Search ............................ 117/94, 99, 102, 117/105

(56) References Cited

U.S. PATENT DOCUMENTS

| | | | | |
|---|---|---|---|---|
| 4,966,860 A | * | 10/1990 | Suzuki et al. | 438/509 |
| 5,989,340 A | * | 11/1999 | Stephani et al. | 117/204 |
| 6,107,168 A | * | 8/2000 | Rupp | 438/509 |
| 6,475,456 B2 | * | 11/2002 | Nakano et al. | 423/328.2 |

* cited by examiner

Primary Examiner—Felisa Hiteshew
(74) Attorney, Agent, or Firm—Armstrong, Kratz, Quintos, Hanson & Brooks, LLP

(57) ABSTRACT

To economically and easily fabricate a single crystal silicon carbide thin film. The apparatus for fabricating a single crystal silicon carbide thin film comprises a film-formation chamber 200 adapted to receive a SOI substrate 100 for film-formation, a gas supply means 300 for supplying various gases G1 to G4 necessary to fabricate a single crystal silicon carbide thin film to the film-formation chamber 200, a gas treatment means 500 for treating argon gas as an inert gas G1, propane gas as a hydrocarbon-based gas G2, hydrogen gas as a carrier gas, and oxygen gas G4 supplied to the film-formation chamber 200, and a temperature control means 400 for controlling the temperature of the film-formation chamber 200.

5 Claims, 1 Drawing Sheet

[Fig. 1]
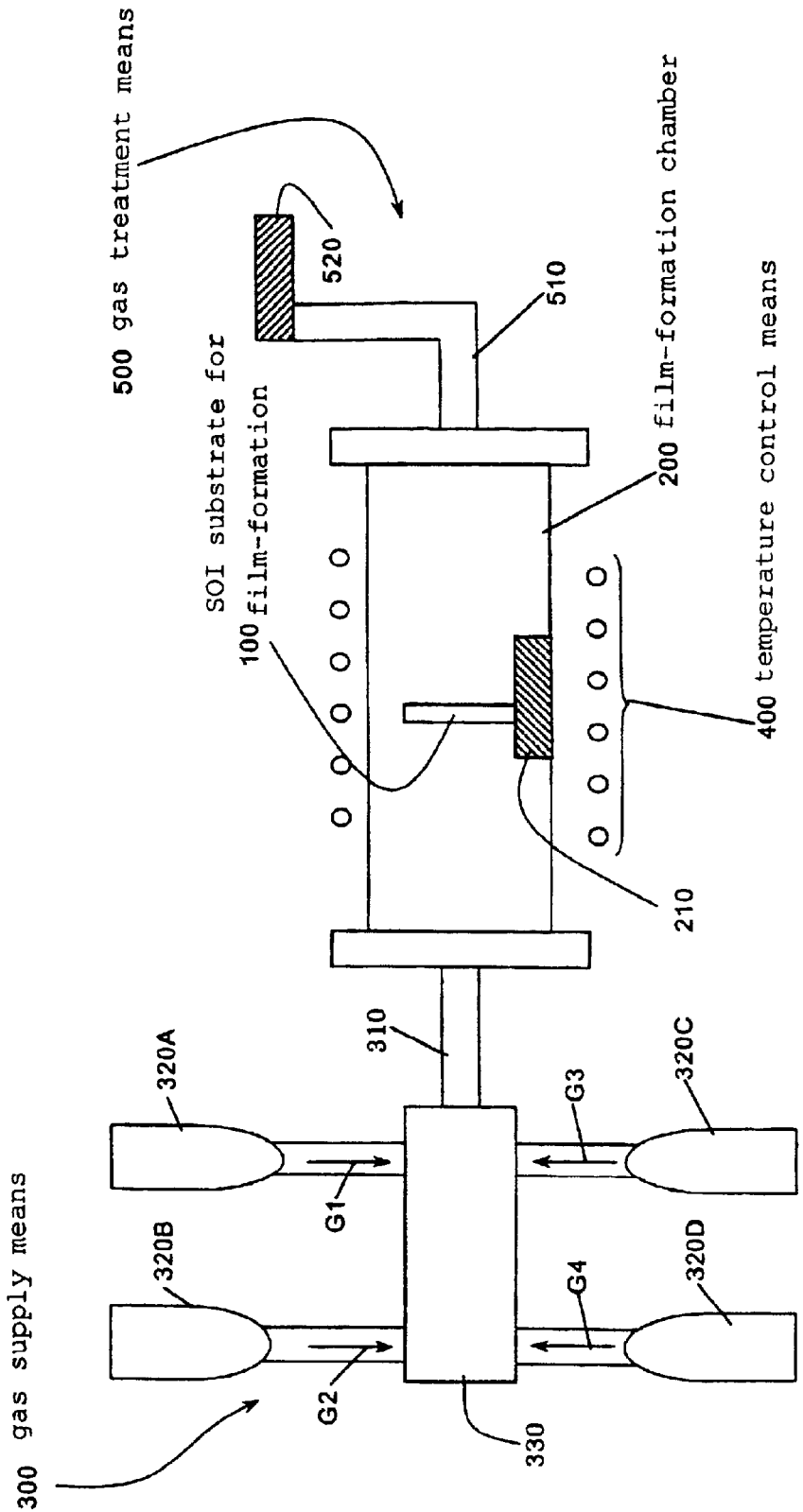

SINGLE CRYSTAL SILICON CARBIDE THIN FILM FABRICATION METHOD AND FABRICATION APPARATUS OF THE SAME

BACKGROUND OF THE INVENTION

1. Field of the Invention

The present invention relates to a single crystal silicon carbide thin film fabrication method and a fabrication apparatus of the same.

2. Prior Art

Since a single crystal silicon carbide (SiC) is not only excellent in thermal and chemical stability but also tough in mechanical strength and durable to radiation of radiation beams, it has been drawing attention as a substrate for epitaxial growth of gallium nitride widely used for a semiconductor device material of the next generation as well as a substrate of light emitting device.

For such a single crystal silicon carbide thin film fabrication method, a sublimation recrystallization method using a silicon carbide seed crystal, a plasma CVD method and the like have become a main stream.

However, a conventional sublimation recrystallization method requires a ultra high temperature process in the vicinity of 1,700° C. in addition to the necessity of a silicon carbide seed crystal with a high purity. Whereas, in the plasma CVD method, a film-formation chamber is required to be kept highly vacuum in the film-formation process. That is, both methods are rather problematic in terms of the cost and the time. Further, these conventional methods, it is difficult to satisfy the requirement of fabrication with a large diameter.

SUMMARY OF THE INVENTION

The present invention has been achieved taking account of the above described situations and aims to provide a single crystal silicon carbide thin film fabrication method capable of economically and easily fabricating a single crystal silicon carbide thin film and a fabrication apparatus for the method.

A single crystal silicon carbide thin film fabrication method according to the invention is to convert a silicon layer on the surface of a SOI substrate for film-formation into a single crystal silicon carbide thin film by a chemical reaction carried out by setting the SOI substrate for film-formation in a film-formation chamber and increasing the ambient temperature of the film-formation chamber to 1,200 to 1,405° C. while passing hydrogen gas and passing also a hydrocarbon-based gas being kept in a ratio of 1 to 5% by volume to hydrogen gas.

Further, a single crystal silicon carbide thin film fabrication apparatus according to the invention comprises a film-formation chamber adapted to receive a SOI substrate for film-formation, a gas supply means for supplying various gases necessary to fabricate a single crystal silicon carbide thin film to the film-formation chamber, a gas treatment means for treating gases supplied to the film-formation chamber, and a temperature control means for controlling the temperature of the film-formation chamber.

BRIEF DESCRIPTION OF THE DRAWING

FIG. 1 is a schematic configuration view of a single crystal silicon carbide thin film fabrication apparatus according to an embodiment of the invention.

EMBODIMENT

FIG. 1 is a schematic configuration view of a single crystal silicon carbide thin film fabrication apparatus according to an embodiment of the invention.

A single crystal silicon carbide thin film fabrication apparatus according to an embodiment of the invention comprises a film-formation chamber 200 adapted to receive a SOI substrate 100 for film-formation, a gas supply means 300 for supplying various gases G1 to G4 necessary to fabricate a single crystal silicon carbide thin film to the film-formation chamber 200, a gas treatment means 500 for treating gases G1 to G4 supplied to the film-formation chamber 200, and a temperature control means 400 for controlling the temperature of the film-formation chamber 200.

The film-formation chamber 200 is made of silicon carbide and has a substrate holder 210 in the inside adapted to set the SOI substrate 100 for film-formation thereon. The substrate holder 210 is also made of silicon carbide.

A heater as the temperature control means 400 is installed in the surrounding of the film-formation chamber 200. By applying electric power to the heater, the ambient temperature of the inside of the film-formation chamber 200 is controlled.

To the film-formation chamber 200, a gas supply pipe 310 composing a portion of the gas supply means 300 is connected. The gas supply pipe 310 is connected to four gas bombs 320A, 320B, 320C, and 320D composing some portions of the gas supply means 300. To the gas supply pipe 310 with such a constitution is equipped with a switching valve 330 so as to switch the gases to be supplied to the film-formation chamber 200. Incidentally, the gas bomb 320A is charged with argon gas as an inert gas G1, the gas bomb 320B with propane gas as a hydrocarbon-based gas G2, the gas bomb 320C with hydrogen gas as a carrier gas G3, and the gas bomb 320D with oxygen gas G4, respectively.

Further, a gas discharge pipe 510 composing a portion of the gas treatment means 500 is formed in the foregoing film-formation chamber 200. In the gas discharge pipe 510, a combustion apparatus 520, which is one constituent unit of the gas treatment means 500, is installed. The gas discharged is burned by the combustion apparatus 520, so that treatment can be carried out safely.

The foregoing substrate holder 210 is installed between the gas supply pipe 310 and the gas discharge pipe 510 to surely expose the SOI substrate 100 for film-formation to gases supplied to the film-formation chamber 200.

A single crystal silicon carbide thin film fabrication method by the single crystal silicon carbide thin film fabrication apparatus constituted in such a manner is as follows.

That is, the single crystal silicon carbide thin film fabrication method is to convert a silicon layer on the surface of the foregoing SOI substrate 100 for film-formation into a single crystal silicon carbide thin film by a chemical reaction carried out by setting the SOI substrate 100 for film-formation in a film-formation chamber 200 and increasing the ambient temperature of the film-formation chamber 200 to 1,270° C. while passing hydrogen gas as the carrier gas G3 and passing also a hydrocarbon-based gas as the hydrocarbon-based gas G2 being kept in a ratio of 1% by volume to hydrogen gas as the carrier gas G3.

For example, if the supply amount of hydrogen gas as the carrier gas G3 is 1,000 cc/min, the supply amount of propane gas as the hydrocarbon-based gas G2 is 10 cc/minutes.

Hydrogen gas as the carrier gas G3 and propane gas as the hydrocarbon-based gas G2 are introduced into the inside of the film-formation chamber 200 through the foregoing gas supply pipe 310 and led to the combustion apparatus 520 through the gas discharge pipe 510 to be burned. Consequently, hydrogen gas as the carrier gas G3 and propane gas as the hydrocarbon-based gas G2 are prevented from being discharged out of the film-formation chamber 200 as gases as they are.

When the ambient temperature in the inside of the film-formation chamber 200 is increased to 1,270° C. while propane gas as the hydrocarbon-based gas G2 being supplied to the film-formation chamber 200, an extremely thin and low temperature silicon carbide buffer layer is formed on the surface of the SOI substrate 100 for film-formation until the ambient temperature in the inside of the film-formation chamber 200 reaches 1,270° C.

After the thin and low temperature silicon carbide buffer layer is formed during heating, the ambient temperature in the inside of the film-formation chamber 200 reaches 1,270° C. At that time, silicon on the surface of the SOI substrate 100 for film-formation is reacted with carbon fabricated by decomposition of propane gas as the hydrocarbon-based gas G2 to form a single crystal silicon carbide thin film.

By growing the foregoing thin and low temperature silicon carbide buffer layer, the surface roughness of the SOI substrate 100 for film-formation after the single crystal silicon carbide thin film-formation can be improved.

If the reaction for formation of the foregoing single crystal silicon carbide thin film is carried out while spending a sufficient time, the silicon layer on the surface of the SOI substrate 100 for film-formation is completely converted into a single crystal silicon carbide thin film. Whether the foregoing reaction is sufficiently carried out or not can be confirmed based on whether carbon excessively supplied to the surface of the SOI substrate 100 for film-formation after the reaction is deposited as a thin film (a carbon thin film) or not.

At that time, the excessive carbon thin film deposited on the surface of the SOI substrate 100 for film-formation is removed by the following method.

That is, after the foregoing reaction, propane gas as the hydrocarbon-based gas G2 and hydrogen gas as the carrier gas in the film-formation chamber 200 are replaced with argon gas as the inert gas G1 and at the same time the SOI substrate 100 for film-formation is cooled. In this case, by changing the switching valve 330 of the gas supply means 300, the supply of propane gas as the hydrocarbon-based gas G2 and hydrogen gas as the carrier gas G3 to the film-formation chamber 200 can be stopped and at the same time argon gas as the inert gas G1 is supplied.

When the temperature of the SOI substrate 100 for film-formation is decreased to around 650° C., oxygen gas G4 is mixed in a prescribed ratio with argon gas as the inert gas G1, so that the carbon thin film can be etched. During the performance of the etching of the carbon thin film, the temperature of the SOI substrate 100 for film-formation is maintained at about 650° C.

More particularly, if the supply amount of oxygen gas G4 is 100 cc/min, the supply amount of argon gas as the inert gas G1 is 1,000 cc/min. Further, the heating period at about 650° C. is in a range from several minutes to several hours.

By maintaining such conditions, the carbon thin film on the surface of the SOI substrate 100 for film-formation causes a chemical reaction; $C+O_2 \rightarrow CO_2$; to be converted to carbon dioxide gas. The carbon dioxide gas is discharged to the outside of the film-formation chamber 200 through the gas discharge pipe 510.

On completion of the above described reaction, that is, the chemical reaction of the carbon thin film on the surface of the SOI substrate 100 for film-formation to the carbon dioxide gas, supply of the oxygen gas G4 is stopped and cooling is carried out under the atmosphere of argon as the inert gas G1.

During the foregoing cooling process, it is made possible to remove the carbon thin film formed on the surface of the SOI substrate 100 for film-formation by etching using oxygen gas G4 and thus the excess carbon thin film can be removed in a series of steps.

In the above-described embodiment, the thickness of the single crystal silicon carbide thin film to be fabricated is equivalent to the thickness of the silicon layer on the surface of the SOI substrate 100 for film-formation. For that, by controlling the thickness of the silicon layer on the surface of SOI substrate 100 for film-formation, a single crystal silicon carbide thin film with an optional thickness can be obtained at a high precision.

Incidentally, in the foregoing embodiment, argon gas is used as the inert gas G1, yet other inert gases may be used. Nevertheless, from a viewpoint of the cost, argon gas has an advantage that it can be obtained most economically at the present time. At the time of supplying the inert gas G1 to the film-formation chamber 200, since the single crystal silicon carbide thin film is already formed on the surface of the SOI substrate 100 for film-formation, it is no need to take the occurrence of pits owing to impurities contained in argon gas into consideration and accordingly the inert gas G1 to be used is not required to be costly and highly pure to result in an advantage in terms of the cost in the case of mass fabrication.

Further, although propane gas is used as the hydrocarbon-based gas G2, other hydrocarbon-based gases, for example, methane gas, ethylene gas, butane gas, and the like, maybe used. Nevertheless, from a viewpoint of the cost, propane gas has an advantage that it can be obtained most economically at the present time. Also, as compared with methane gas and ethylene gas, the content of carbon atom is high, so that propane is supposed to be most preferable from a viewpoint of the efficiency of single crystal silicon carbide thin film fabrication.

Further, although the hydrocarbon-based gas G2 is passed while being adjusted at a ratio of 1% by volume to hydrogen gas as the carrier gas G3 and the ambient temperature of the inside of the film-formation chamber 200 is increased to 1,270° C., it is confirmed by experiments that the hydrocarbon-based gas G3 may be passed in a range of the ratio from 1 to 5% by volume to hydrogen gas as the carrier gas G3 and the ambient temperature of the inside of the film-formation chamber 200 may be increased to 1,200 to 1,405° C.

Effect of the Invention

A single crystal silicon carbide thin film fabrication method according to the present invention is for converting a silicon layer on the surface of a SOI substrate for film-formation into a single crystal silicon carbide thin film by a chemical reaction carried out by setting the SOI substrate for film-formation in a film-formation chamber and increasing the ambient temperature of the film-formation chamber to 1,200 to 1,405° C. while passing hydrogen gas and passing also a hydrocarbon-based gas being kept in a ratio of 1 to 5% by volume to hydrogen gas.

According to this fabrication method, a single crystal silicon carbide thin film can be fabricated without requiring the inside of a film-formation chamber to be vacuum state, unlike that in a conventional method. Accordingly, by this single crystal silicon carbide thin film fabrication method, the fabrication steps can be simplified and consequently, the method can contribute to the cost down. Further, unlike a conventional film-formation, a silicon carbide seed crystal is made no need and an existing SOI substrate is enabled to be used, so that the method can contribute to the enlargement of the diameter and the cost down.

Also, by carrying out the chemical reaction to the excessive extent that the carbon thin film is deposited on the obtained single crystal silicon carbide thin film, the silicon on the surface of the SOI substrate for film-formation is reacted with carbon fabricated by decomposition of propane gas as the hydrocarbon-based gas and whether the single crystal silicon carbide thin film is formed or not is to be judged accordingly and the carbon thin film can be removed by etching by heating the SOI substrate for film-formation to 550° C. or higher under the atmosphere of the inert gas mixed with oxygen gas at a prescribed ratio.

In such a manner, in the cooling process of the SOI substrate for film-formation, the excess carbon thin film deposited on the single crystal silicon carbide thin film can be removed by etching. Consequently, without adding a special removal process especially for the carbon thin film, the excess carbon thin film can be removed.

Further, the single crystal silicon carbide thin film fabrication apparatus according to the present invention comprises a film-formation chamber adapted to receive a SOI substrate for film-formation, a gas supply means for supplying various gases necessary to fabricate a single crystal silicon carbide thin film to the film-formation chamber, a gas treatment means for treating gases supplied to the film-formation chamber, and a temperature control means for controlling the temperature of the film-formation chamber.

Consequently, this single crystal silicon carbide thin film fabrication apparatus is capable of easily carrying out the above described single crystal silicon carbide thin film fabrication method. Moreover, since it comprises the gas treatment means, safety treatment of exhaust gases is made possible.

What is claimed is:

1. A single crystal silicon carbide thin film fabrication method for converting a silicon layer on the surface of a SOI substrate for film-formation into a single crystal silicon carbide thin film by a chemical reaction, wherein said method comprises steps of setting said SOI substrate for film-formation in a film-formation chamber and increasing the ambient temperature of the film-formation chamber to 1,200 to 1,405° C. while passing hydrogen gas and passing also a hydrocarbon-based gas being kept in a ratio of 1 to 5% by volume to hydrogen gas.

2. The single crystal silicon carbide thin film fabrication method according to claim 1, wherein said chemical reaction is carried out under atmospheric pressure.

3. The single crystal silicon carbide thin film fabrication method according to claim 1 or claim 2, wherein said chemical reaction is carried out to an excess extent until a carbon thin film is deposited on the obtained single crystal silicon carbide thin film.

4. The single crystal silicon carbide thin film fabrication method according to claim 3, wherein said carbon thin film excessively deposited on said single crystal silicon carbide thin film is removed by etching by heating said SOI substrate for film-formation to 550° C. or higher under the atmosphere of an inert gas mixed with oxygen gas in a prescribed ratio.

5. A single crystal silicon carbide thin film fabrication apparatus comprising a film-formation chamber adapted to receive a SOI substrate for film-formation, a gas supply means for supplying various gases necessary to fabricate a single crystal silicon carbide thin film to said film-formation chamber, a gas treatment means for treating gases supplied to said film-formation chamber, and a temperature control means for controlling the temperature of said film-formation chamber.

* * * * *